(12) United States Patent
Kim et al.

(10) Patent No.: US 8,031,554 B2
(45) Date of Patent: Oct. 4, 2011

(54) CIRCUIT AND METHOD FOR CONTROLLING LOADING OF WRITE DATA IN SEMICONDUCTOR MEMORY DEVICE

(75) Inventors: Sang-Hui Kim, Gyeonggi-do (KR); Kwang-Hyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 298 days.

(21) Appl. No.: 12/344,687

(22) Filed: Dec. 29, 2008

(65) Prior Publication Data

US 2010/0008166 A1    Jan. 14, 2010

(30) Foreign Application Priority Data

Jul. 10, 2008  (KR) .................... 10-2008-0067199

(51) Int. Cl.
*G11C 8/00*  (2006.01)
(52) U.S. Cl. ............ 365/233.16; 365/233.1; 365/233.18
(58) Field of Classification Search ............... 365/233.1, 365/233.11, 233.16, 233.18, 233.19
See application file for complete search history.

(56) References Cited

U.S. PATENT DOCUMENTS

| 6,167,487 A * | 12/2000 | Camacho et al. ............. 711/131 |
| 7,143,258 B2 * | 11/2006 | Bae .............................. 711/167 |
| 2005/0251713 A1 * | 11/2005 | Lee .............................. 714/718 |

FOREIGN PATENT DOCUMENTS

| KR | 1020050067448 A | 7/2005 |
| KR | 1020080049625 A | 6/2008 |

OTHER PUBLICATIONS

Notice of Allowance issued from Korean Intellectual Property Office on Dec. 17, 2009.

* cited by examiner

*Primary Examiner* — Richard Elms
*Assistant Examiner* — Hien Nguyen
(74) *Attorney, Agent, or Firm* — IP & T Group LLP

(57) ABSTRACT

A circuit for controlling the loading of write data in a semiconductor memory device includes a global bus; a data block configured to selectively load data of a predetermined first burst length or data of a second burst length, which is a half of the first burst length, for writing on the global bus in response to a control signal; and a memory bank configured to write the data of the first burst length or the data of the second burst length.

8 Claims, 3 Drawing Sheets

CIRCUIT AND METHOD FOR CONTROLLING LOADING OF WRITE DATA IN SEMICONDUCTOR MEMORY DEVICE

CROSS-REFERENCE TO RELATED APPLICATION

The present invention claims priority of Korean patent application number 10-2008-0067199, filed on Jul. 10, 2008, which is incorporated by reference in its entirety.

BACKGROUND OF THE INVENTION

The present invention relates to a write operation of a semiconductor memory device, and more particularly, to a circuit and method for controlling loading of data to be written.

In general, a semiconductor memory device such as a Dynamic Random Access Memory (DRAM) is divided into a core region for processing data and a data input/output region for transceiving data with other semiconductor devices. A data block is provided in the data input/output region to buffer external data and transmit the buffered data to the core region.

FIG. 1 is a block diagram illustrating a conventional circuit for a write operation including a data block for transmitting external data to a core region. The circuit illustrates an example applied to a Dual Data Rate 3 (DDR3) Synchronous Dynamic Random Access Memory (SDRAM) according to Joint Electron Device Engineering Council (JEDEC) specifications.

As shown, a data write operation is performed in such a manner that write drivers 32 and 34 of a memory bank 30 select data on a global bus 20 when a data block 10 receives data for writing and loads the data for writing on the global bus 20.

However, the data write operation increases power consumption by unnecessarily charging and discharging a Global Input/Output (GIO) bus which is the longest metal line in a semiconductor chip. The data write operation also causes coupling to a signal line adjacent to the GIO bus since the data block 10 writes data in the same way as a burst length is 8 even when a burst length of the data for writing is 4 and so unnecessarily occupies the GIO bus corresponding to the burst length 4. For example, according to the JEDEC specifications, in case of a burst length 4 (BL4) mode or a burst chop 4 (BC4) mode, the data block 10 loads four data on two GIO buses GIO_O<0:3> and GIO_O<4:7>, each of which can receive the four data by two using Input Output Sense Amplifiers (IOSA) 14 and 18 of a global input/output transmitting unit, and the write drivers 32 and 34 in an octet of the memory bank 30 select the data on the corresponding GIO buses and drive the data for writing.

Therefore, a new data write method is required to reduce power consumption due to unnecessary charging and discharging of the GIO bus in the semiconductor memory device and remove coupling caused in the signal line adjacent to the GIO bus.

SUMMARY OF THE INVENTION

Therefore, an embodiment of the present invention is directed to providing a circuit and a method for controlling loading of write data to reduce power consumption and noise due to charging and discharging of a GIO bus as much as unnecessary data, which are problems of the conventional technology that selects data as much as a burst length after inputting the data larger than the burst length loaded on the GIO bus in a memory bank in case of an operation mode in which the data of the specific burst length are provided for writing in a semiconductor memory device such as a Dynamic Random Access Memory (DRAM).

In accordance with an aspect of the present invention, there is provided a circuit for controlling the loading of write data in a semiconductor memory device including a global bus; a data block configured to selectively load data of a predetermined first burst length or data of a second burst length, which is a half of the first burst length, for writing on the global bus in response to a control signal; and a memory bank configured to write the data of the first burst length and or data of the second burst length.

In accordance with another aspect of the present invention, there is provided a circuit for controlling loading of write data in a semiconductor memory device including a control signal generator configured to generate a control signal according to burst length information; a data input unit configured to receive data of a predetermined first burst length or data of a second burst length, which is a half of the first burst length, for writing; a data aligning unit configured to align the data inputted to the data input unit into the data of the first burst length; a global input/output transmitting unit configured to receive the data aligned by the data aligning unit and selectively load the data of the first burst length or the data of the second burst length on a global bus in response to the control signal; and a memory bank configured to write the data of the first burst length or the data of the second burst length loaded on the global bus.

In accordance with another aspect of the present invention, there is provided a method for controlling loading of write data in a semiconductor memory device including a global bus, a data block configured to receive data for writing and loading the data on the global bus, and a memory bank configured to write the data loaded on the global bus including generating a control signal for a selective loading operation of the data block according to burst length information; and selectively loading data of a predetermined first burst length or data of a second burst length, which is a half of the first burst length, for writing on the global bus in response to the control signal.

The embodiment of the present invention uses a method of selecting data for writing from the data block instead of a method of selecting data for writing from the memory bank. Therefore, the embodiment of the present invention solves problems such as increased power consumption due to unnecessary charging and discharging of the GIO bus which is the longest metal line in a semiconductor memory chip and noise due to coupling.

DESCRIPTION OF SPECIFIC EMBODIMENTS

Other objects and advantages of the present invention can be understood by the following description, and become apparent with reference to the embodiments of the present invention.

Figure 2:
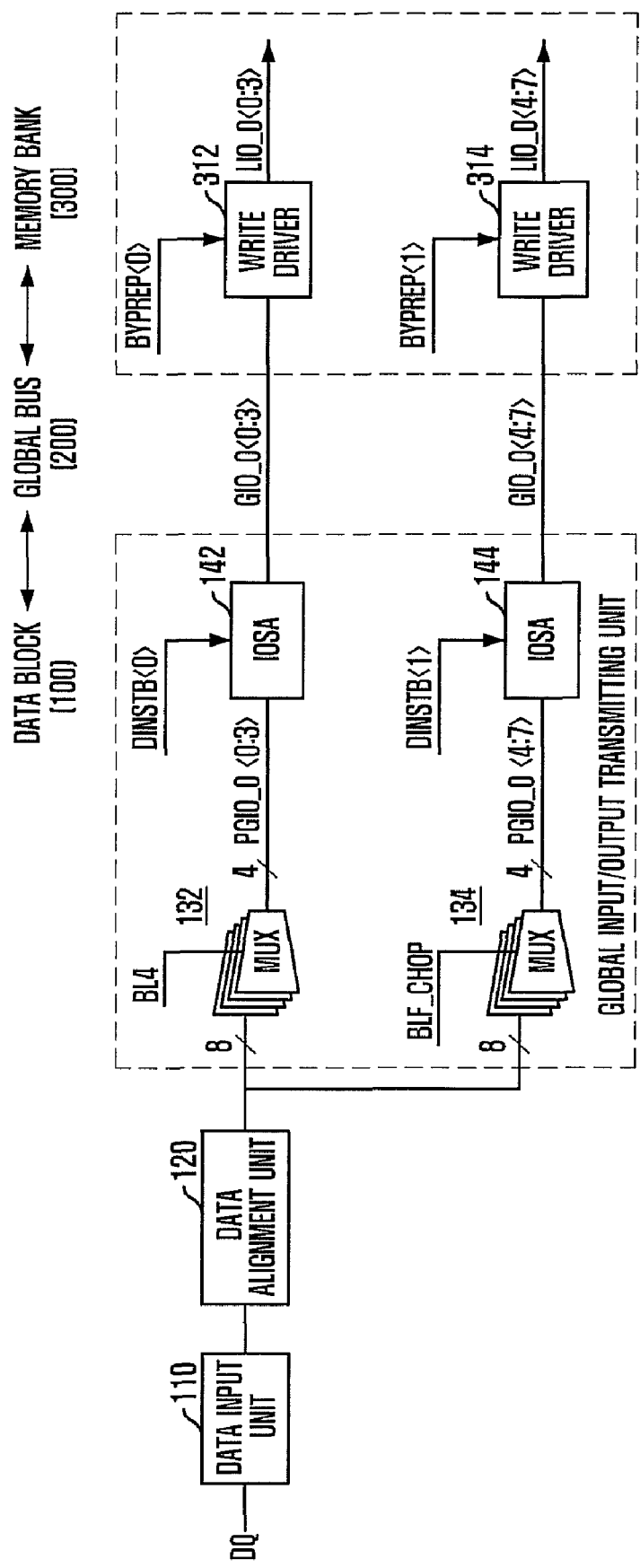
FIG. 2 is a block diagram illustrating a circuit for a write operation of a semiconductor memory device in accordance with an embodiment of the present invention.

FIG. 2 is a block diagram illustrating a circuit for a write operation of a semiconductor memory device in accordance with an embodiment of the present invention. The circuit performs a write operation, particularly, an operation of controlling loading of write data and illustrates an example applied to a Dual Data Rate 3 (DDR3) Synchronous Dynamic Random Access Memory (SDRAM).

As shown, a data block 100 is connected to a global bus 200. Data of a predetermined first burst length or data of a second burst length, which is a half of the first burst length, for writing are selectively loaded on the global bus 200. The selective data loading operation of the data block 100 is constructed as illustrated in the following FIG. 3 and controlled by a control signal generator for generating a control signal according to burst length information.

The data block 100 includes a data input unit 110, a data alignment unit 120, and a global input/output transmitting unit. The data input unit 100 receives data DQ inputted for writing. The write data DQ may be the data of the predetermined first burst length or the data of the second burst length, which is a half of the first burst length. For example, a write operation of the DDR3 SDRAM is performed in three modes such as BL4 mode, BL8 mode and On-The-Fly (OTF) mode. In case of the BL8 operation, a burst length of data inputted for writing is 8 bits. In case of the BL4 operation and a burst chop of the OTF, that is, the BL4 operation or a BC4 mode operation, a burst length of data inputted for writing is 4 bits.

The data alignment unit 120 outputs the data of the first burst length by aligning the data inputted to the data input unit 110. For example, in case of the DDR3 SDARM, the data alignment unit 120 receives a rising data signal and a falling data signal from the data input unit 110 and outputs the aligned signals by aligning the rising data signal and the falling data signal on a falling edge of a data strobe signal and on a rising edge of an external clock signal.

The global input/output transmitting unit receives the data of the first burst length, which are aligned by the data alignment unit 120, and selectively loads the data of the first burst length or the data of the second burst length on the global bus 200. The global input/output transmitting unit includes two Multiplexers (MUX) 132 and 134 and two Input Output Sense Amplifiers (IOSA) 142 and 144.

The MUX 132 receives the 8-bit data of the first burst length, which are aligned by the data alignment unit 120, and outputs 4-bit data PGIO_O<0:3> of the second burst length in response to a control signal BL4. The MUX 134 receives the 8-bit data of the first burst length, which are aligned by the data alignment unit 120, and outputs 4-bit data PGIO_O<4:7> of the second burst length in response to a control signal BLF_CHOP. The control signal BL4 represents a case that a write operation mode is BL4. The control signal BLF_CHOP represents a case that a write operation mode is OTF BC4.

The IOSA 142 receives the 4-bit data PGIO_O<0:3> outputted from the MUX 132 and loads the inputted data PGIO_O<0:3> on a first global bus GIO_O<0:3> after sense-amplifying the inputted data PGIO_O<0:3> in response to a control signal DINSTB<0>. The IOSA 144 receives the 4-bit data PGIO_O<4:7> outputted from the MUX 134 and loads the inputted data PGIO_O<4:7> on a second global bus GIO_O<4:7> after sense-amplifying the inputted data PGIO_O<4:7> in response to a control signal DINSTB<1>. The control signals DINSTB<0:1>are data strobe signals generated by the control signal generator illustrated in the following FIG. 3.

The global bus 200 includes the first global bus GIO_O<0:3> and the second global bus GIO_O<4:7> for loading data as much as the second burst length, respectively.

The memory bank 300 is connected to the global bus 200 and writes the data of the first burst length or the data of the second burst length loaded on the global bus 200. The memory bank 300 includes a first write driver 312 and a second write driver 314 which are connected to the first global bus GIO_O<0:3> and the second global bus GIO_O<4:7>, respectively. The first write driver 312 receives the data loaded on the first global bus GIO_O<0:3> and outputs driven write data LIO_O<0:3> after driving writing in response to a control signal BYPREP<0>. The second write driver 314 receives the data loaded on the second global bus GIO_O<4:7> and outputs driven write data LIO_O<4:7> after driving writing in response to a control signal BYPREP<1>.

That is, each of the first and second write drivers 312 and 314 of the memory bank 300 drives writing of the loaded data as much as the second burst length when the data of the first burst length are loaded on both of the first and second global buses GIO_O<0:3> and GIO_O<4:7>. On the other hand, one of the first and second write drivers 312 and 314 drives writing of the loaded data when the data of the second burst length are loaded on one of the first and second global buses GIO_O<0:3> and GIO_O<4:7>. The driven write data are written in a corresponding cell region through a local bus in the memory bank 300.

Figure 1:
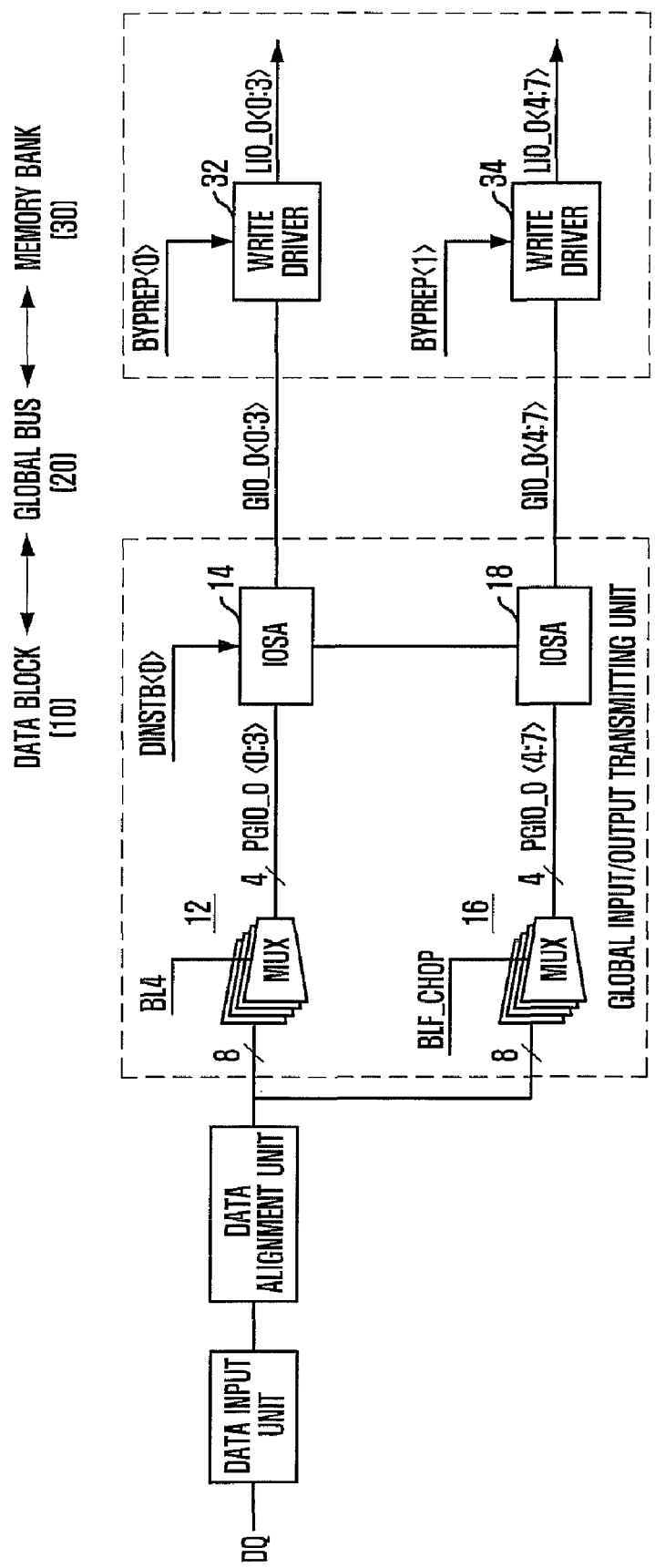
FIG. 1 is a block diagram illustrating a conventional circuit for a write operation of a semiconductor memory device.

As described above, in the conventional technology shown in FIG. 1, the data block 10 loads the 4-bit data on the GIO bus 20 twice so that the 8-bit data are provided to the memory bank 30 when the write operation mode is the BL4 or BC4 operation. Then, only the corresponding one of the write drivers 32 and 34 of the memory bank 30 selects and writes the data. This method corresponds to an operation of selecting where to write data by largely dividing the bank into two right and left parts to utilize all cells in the memory bank even in the BL4/BC4 operations as specified in Joint Electron Device Engineering Council (JEDEC) specifications.

However, as described above, the conventional write method causes problems such as increased power consumption and noise due to coupling. Thus, the embodiment of the present invention uses a method of selecting data for writing from the data block instead of a method of selecting data for writing from the memory bank. That is, the data block controls only the required 4-bit data to be loaded on the GIO bus in response to a data strobe signal which is a control signal indicating burst length information.

Figure 3:
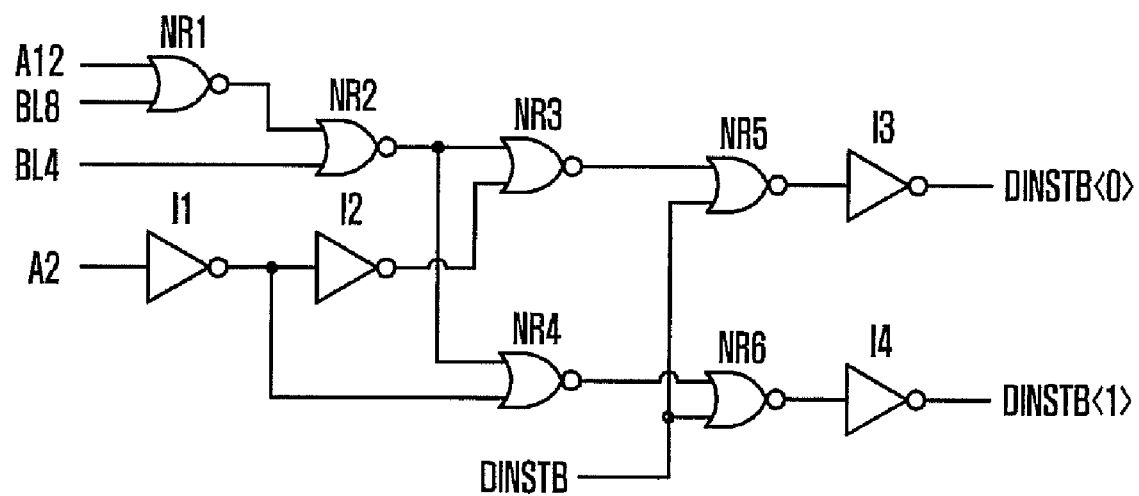
FIG. 3 is a diagram illustrating a circuit for generating a control signal provided to a global input/output transmitting unit illustrated in FIG. 2.

FIG. 3 is a block diagram illustrating a circuit for generating a control signal provided to the global input/output transmitting unit illustrated in FIG. 2. The circuit generates first and second control signals DINSTB<0:1> indicating the burst length information for the selective data loading operation in the data block 100.

As shown, the control signal generator receives first to fourth input signals A12, A2, BL8, and BL4 and generates the first and second control signals DINSTB<0> and DIN-STB<1>. The third and fourth input signals BL4 and BL8 are signals of a level determined in a Mode Register Set (MRS). The first input signal A12 is a column address for discriminating a burst length in case of the OTF. The second input signal A2 is a column address for selecting four among eight octets in case that the burst length is 4. The control signal generator includes first to sixth NOR gates NR1, NR2, NR3, NR4, NR5, and NR6 and first to fourth inverters I1, I2, I3, and I4.

The first NOR gate NR1 receives and performs a NOR operation on the first input signal A12 and the third input signal BL8 to output the NOR operated signal. The second NOR gate NR2 receives and performs a NOR operation on an output of the first NOR gate NR1 and the fourth input signal BL4 to output the NOR operated signal. The first inverter I1 receives and inverts the second input signal A2 to output the inverted signal. The second inverter I2 receives and inverts an output of the first inverter I1 to output the inverted signal. The third NOR gate NR3 receives and performs a NOR operation on an output of the second NOR gate NR2 and an output of the second inverter I2 to output the NOR operated signal. The fourth NOR gate NR4 receives and performs a NOR operation on the outputs of the second NOR gate NR2 and the first inverter I1 to output the NOR operated signal. The fifth NOR gate NR5 receives and performs a NOR operation on an output of the third NOR gate NR3 and a data strobe signal DINSTB to output the NOR operated signal. The sixth NOR gate NR6 receives and performs a NOR operation on an output of the fourth NOR gate NR4 and the data strobe signal DINSTB to output the NOR operated signal. The third inverter I3 receives and inverts an output of the fifth NOR gate NR5 to output the first control signal DINSTB<0> as a result of inverting the output of the fifth NOR gate NR5. The fourth inverter I4 receives and inverts an output of the sixth NOR gate NR6 to output the second control signal DINSTB<1> as a result of inverting the output of the sixth NOR gate NR6. The first and second control signals DINSTB<0> and DINSTB<1> are provided to the IOSAs 142 and 144 of the global input/output transmitting unit of the data block 100 illustrated in FIG. 2, respectively.

As described above, the embodiment of the present invention uses the method of selecting data for writing from the data block instead of the method of selecting data for writing from the memory bank. Therefore, the problems such as increased power consumption due to unnecessary charging and discharging of the GIO bus which is the longest metal line in the semiconductor memory chip and noise due to coupling are solved.

While the present invention has been described with respect to the specific embodiments, it will be apparent to those skilled in the art that various changes and modifications may be made without departing from the spirit and scope of the invention as defined in the following claims.

For example, the above-described embodiment is explained as an example applied to a case that the operation mode of the DDR3 SDRAM is BL4/BC4. However, the spirit of the present invention can be similarly applied to any semiconductor memory device in which data of a specific burst length are inputted to a data block, but data longer than the data inputted to the data block are provided to a memory bank after being loaded on a GIO bus.

Also, the above-described embodiment explains an example that generates the control signal for the selective loading operation in the data block by the circuit illustrated in FIG. 3. However, the spirit of the present invention can be similarly applied to any circuit which generates a control signal for a selective loading operation in a data block by inputting burst length information.

What is claimed is:

1. A circuit for controlling loading of write data in a semiconductor memory device, comprising:
    a global bus;
    a data block configured to selectively load data of a predetermined first burst length or data of a second burst length, which is a half of the first burst length, for writing on the global bus in response to a control signal; and
    a memory bank configured to write the data of the first burst length or the data of the second burst length,
    wherein the memory bank includes first and second write drivers respectively connected to the global bus,
    each of the first and second write drivers writes the loaded data as much as the second burst length when the data of the first burst length are loaded on the global bus, and
    one of the first and second write drivers writes the loaded data when the data of the second burst length are loaded on the global bus.

2. The circuit for controlling the loading of write data as recited in claim 1, further comprising a control signal generator configured to generate a control signal for a selective loading operation of the data block according to burst length information and provide the control signal to the data block.

3. The circuit for controlling loading of write data as recited in claim 1, wherein the data block includes:
    a data input unit configured to receive the data of the first burst length or the data of the second burst length for writing; and
    a global input/output transmitting unit configured to receive data inputted to the data input unit and load the data of the first burst length or the data of the second burst length on the global bus according to the control signal.

4. The circuit for controlling loading of write data as recited in claim 1, wherein the data of the first burst length are 8-bit data, and the data of the second burst length are 4-bit data.

5. A circuit for controlling loading of write data in a semiconductor memory device comprising:
    a control signal generator configured to generate a control signal according to burst length information;
    a data input unit configured to receive data of a predetermined first burst length or data of a second burst length, which is a half of the first burst length, for writing;
    a data aligning unit configured to align the data inputted to the data input unit into the data of the first burst length;
    a global input/output transmitting unit configured to receive the data aligned by the data aligning unit and selectively load the data of the first burst length or the data of the second burst length on a global bus in response to the control signal; and
    a memory bank configured to write the data of the first burst length or the data of the second burst length loaded on the global bus,
    wherein the global bus includes first and second global buses configured to respectively load data as much as the second burst length.

6. The circuit for controlling loading of write data as recited in claim 5, wherein the global input/output transmitting unit includes a sense amplifier configured to amplify the data of the first burst length or the data of the second burst length to be loaded on the global bus.

7. The circuit for controlling loading of write data as recited in claim 5, wherein the memory bank includes first and second write drivers respectively connected to the first and second global buses;
    each of the first and second write drivers writes the loaded data as much as the second burst length when the data of the first burst length are loaded on both of the first and second global buses; and
    one of the first and second write drivers writes the loaded data when the data of the second burst length are loaded on one of the first and second global buses.

8. The circuit for controlling loading of write data as recited in claim 5, wherein the data of the first burst length are 8-bit data, and the data of the second burst length are 4-bit data.

* * * * *